(12) United States Patent
Tsujii

(10) Patent No.: US 6,489,791 B1
(45) Date of Patent: Dec. 3, 2002

(54) BUILD OFF SELF-TEST (BOST) TESTING METHOD

(75) Inventor: Toshiyuki Tsujii, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 16 days.

(21) Appl. No.: 09/596,708

(22) Filed: Jun. 19, 2000

(30) Foreign Application Priority Data

Dec. 28, 1999 (JP) .............................. 11-373241

(51) Int. Cl.[7] .................................. G01R 31/02
(52) U.S. Cl. ........................ 324/755; 324/763
(58) Field of Search .............................. 324/755, 754, 324/758, 763, 765; 714/733, 7, 710, 718

(56) References Cited

U.S. PATENT DOCUMENTS 6,065,134 A * 5/2000 Bair et al. ...................... 714/7
6,194,907 B1 * 2/2001 Kanao et al. ............... 324/754

FOREIGN PATENT DOCUMENTS

JP 8-304459 11/1996

* cited by examiner

*Primary Examiner*—N. Le
*Assistant Examiner*—James Kerveros
(74) *Attorney, Agent, or Firm*—Leydig Voit & Mayer, Ltd.

(57) ABSTRACT

A large scale integrated circuit for a build off self-test and a device to be tested are mounted in a single socket so that their respective electrodes are in direct contact.

3 Claims, 5 Drawing Sheets

BUILD OFF SELF-TEST (BOST) TESTING METHOD

BACKGROUND OF THE INVENTION

1. Field of the Invention

The present invention relates to a build off self-test (BOST) testing method. More particularly, the invention relates to a method for performing tests at high speeds with high precision, and to a socket and a semiconductor device for use with that method.

2. Description of the Background Art

One way to facilitate device testing procedures has been known conventionally as BOST (Build Off Self Test). The BOST involves mounting on a test board an LSI or circuits for expediting examinations of a device under test (called the DUT hereunder, including an LSI or the like to be tested in bare-chip or packaged form). As such, the BOST is designed to carry out tests on high-performance multi-function DUTs by use of an unsophisticated low-performance tester.

In a typical testing setup, a high-frequency oscillator is mounted on the test board so that a clock signal generated thereby is used to perform tests on a DUT at frequencies higher than the tester frequency. In another setup, an operation amplifier is mounted on the test board so as to test analog signals.

FIG. 14 is a schematic view of a setup in which to practice a conventional BOST method. Referring to FIG. 14, an LSI 1008 for use with the BOST (LSI or the like under test in bare-chip or packaged form, called the BOST LSI hereunder) receives a simple control signal from a tester 1001. In turn, the BOST LSI 1008 generates test signals necessary for testing a DUT 1007, checks to see if output signals from the DUT 1007 are correct, and notifies the tester 1001 of the results of the tests on the DUT 1007.

The BOST LSI 1008 and DUT 1007 are mounted on different sockets 1012 attached to a test board 1003 and exchange relevant signals through printed wiring 1010. The BOST LSI 1008 and DUT 1007 use paths indicated by broken lines in the printed wiring 1010 in order to receive from the tester 1001 the power necessary for their operations. The tester 1001 thus causes the BOST LSI 1008 to operate.

Furthermore, the DUT 1007 uses the printed wiring 1010 indicated by solid lines to exchanges signals with the BOST LSI 1008 for testing.

Part of the signals input and output to and from the DUT 1007 may be exchanged directly with the tester 1001. This arrangement is intended to alleviate loads on the BOST LSI 1008.

In the conventional BOST setup outlined above, the BOST LSI 1008 and DUT 1007 are mounted on different sockets 1012 and exchange signals therebetween via the printed wiring 1010. This has led to problems such as a mismatch of impedance due to contactors 1006 of the different sockets 1012, or signal delays over the printed wiring 1010.

SUMMARY OF THE INVENTION

The present invention has been conceived to solve the previously mentioned problems, and general a object of the present invention are to provide a novel and useful testing method, a socket for use with the method, and a semiconductor device for use with the method.

The above object of the present invention is achieved by a testing method for use with a BOST setup. In the method, there are mounted on a single socket a BOST semiconductor device and a semiconductor device under test. The semiconductor device under test is tested using the BOST semiconductor device.

The above object of the present invention is also achieved by a socket for use in a BOST setup. The socket includes a socket body with a space to accommodate a first semiconductor device. A first cap with a space to accommodate a second semiconductor device is provided so as to push electrodes of the first semiconductor against contactors. A second cap pushing electrodes of the second semiconductor device against the electrodes of the first semiconductor device is also provided.

The above object of the present invention is further achieved by a semiconductor device for use in a BOST setup described below. The semiconductor device includes a BGA structure having conductive elastic elements attached to electrodes instead of solder balls.

Other objects and further features of the present invention will be apparent from the following detailed description when read in conjunction with the accompanying drawings.

DESCRIPTION OF THE PREFERRED EMBODIMENTS

First Embodiment

Figure 1:
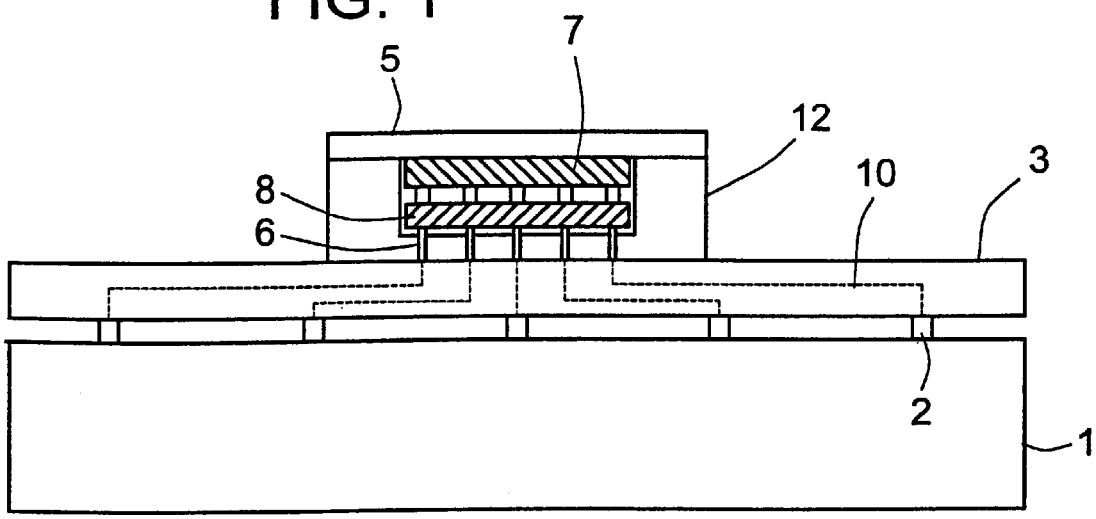
FIG. 1 is a schematic view of a setup in which to practice a BOST method as a first embodiment of this invention.

Preferred embodiments of this invention are described below. FIG. 1 is a schematic view of a setup in which to practice a BOST method as the first embodiment of the invention. Referring to FIG. 1, a BOST LSI 8 and a DUT 7 are mounted on a single socket 12. This setup brings electrodes of the BOST LSI 8 and DUT 7 into direct contact with one another for testing.

Signals of a tester 1 are input to the BOST LSI 8 via POGO pins 2 of the tester 1, printed wiring 10 of a test board 3, and contactors 6 of the socket 12. Because the signals are exchanged at low speeds between the tester 1and the BOST LSI 8, a complicated transmission line configuration does not adversely affect testing.

High-speed signals for testing the DUT 7 are fed from the electrodes of the BOST LSI 8 directly to the electrodes of the DUT 7, so that these signals are not affected by the transmission line configuration. This allows high-speed tests to be carried out with high precision.

Although the setup of FIG. 1 is shown supplying power and signals to the DUT 7 via the BOST LSI 8, this is not limitative of the invention. Alternatively, power or part of the signals may be sent directly to the DUT 7 from the tester 1. There may be a plurality of BOST LSIs 8 (which may be stacked one upon another or arranged side by side).

The first embodiment described above allows high-speed tests to be carried out with high precision while being less influenced by the transmission line configuration than before.

Second Embodiment

Figure 2:
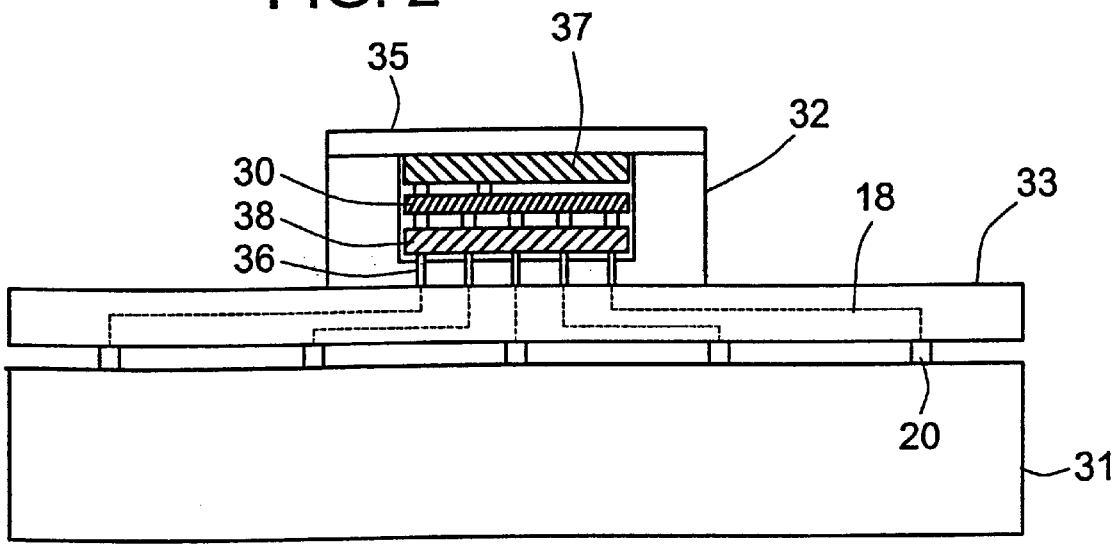
FIG. 2 is a schematic view of a setup in which to practice a BOST method as a second embodiment of the invention.

FIG. 2 is a schematic view of a setup in which to practice a BOST method as the second embodiment of the invention. Referring to FIG. 2, a BOST LSI 38, an intermediate board 30, and a DUT 37 are mounted on a single socket 32. Electrodes of the BOST LSI 38, intermediate board 30 and DUT 37 are brought into direct contact with one another for testing.

Signals from the tester 31 are input to the BOST LSI 38 via POGO pins 20 of the tester 31, printed wiring 18 of a test board 33, contactors 36 of the socket 32, and intermediate board 30. Because the signals are exchanged at low speeds between the tester 31 and the BOST LSI 38, a complicated transmission line configuration does not adversely affect testing.

The electrodes of the intermediate board 30 permit supply of signals (power) of the BOST LSI 38 to suitable electrodes of the DUT 37. This arrangement drastically reduces the length of transmission lines and thereby allows high-speed tests to be performed with high precision.

Figure 3:
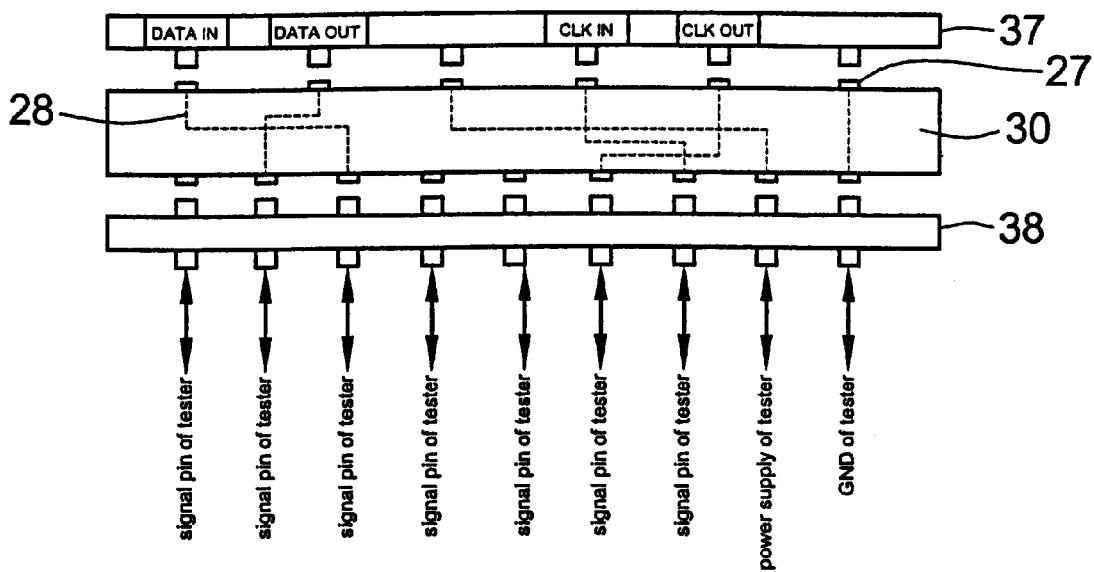
FIG. 3 is a schematic view of an intermediate board for use with the second embodiment.

FIG. 3 is a schematic view of an intermediate board for use with the second embodiment. Referring to FIG. 3, the intermediate board 30 has electrodes 27 furnished on its face and back and includes wiring 28 to interconnect the electrodes 27. The wiring 28 is provided to ensure electrical conduction to the electrodes of the DUT 37 as well as to the electrodes of the BOST LSI 38.

The BOST LSI 38 is designed for general-purpose usage so as to be able to deal with various LSIs to be tested. The intermediate board 30 is utilized to correct mismatches in electrodes, when the roles or positions of electrodes are different between the BOST LSI 38 and DUT 37.

Unlike the first embodiment, the second embodiment described above eliminates the need for aligning the electrodes of the BOST LSI 38 with those of the DUT 37. This makes it possible to apply the general-purpose BOST LSI to high-speed testing.

Third Embodiment

Figure 4:
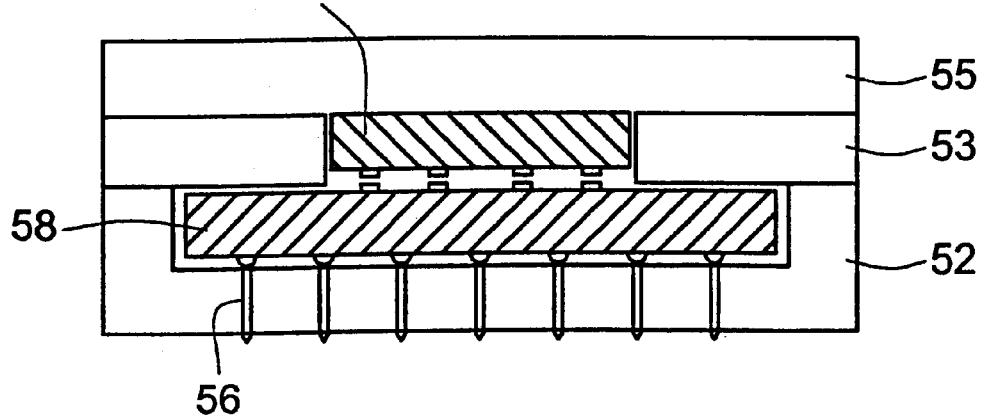
FIG. 4 is a schematic view of a socket practiced as a third embodiment of the invention.

FIG. 4 is a schematic view of a socket practiced as the third embodiment of the invention. Referring to FIG. 4, this socket is for use with the method of the first or the second embodiment. The socket is constituted by a socket body 52 with a space to accommodate a BOST LSI 58, and by two caps 53 and 55. The cap 53 with a space to accommodate a DUT 57 is used to push electrodes of the BOST LSI 58 against contactors 56. The cap 55 is used to push the electrodes of the DUT 57 against those of the BOST LSI 58.

In this socket, the BOST LSI 58 supports the DUT 57. The socket components have clearance therebetween such that when assembled, the components ensure alignment between the contactors 56 and the electrodes of the BOST LSI 58, as well as between the electrodes of the DUT 57 and those of the BOST LSI 58.

Although the BOST LSI 58 is shown positioned under the DUT 57, this is not limitative of the invention. The BOST LSI 58 may be placed alternatively on top of the DUT 57. Whereas the contactors 56 are shown connected only to the electrodes of the BOST LSI 58, they may also be connected alternatively to the electrodes of the DUT 57.

The third embodiment described above brings the BOST LSI and DUT into secure contact with each other over the shortest possible distance.

Fourth Embodiment

Figure 5:
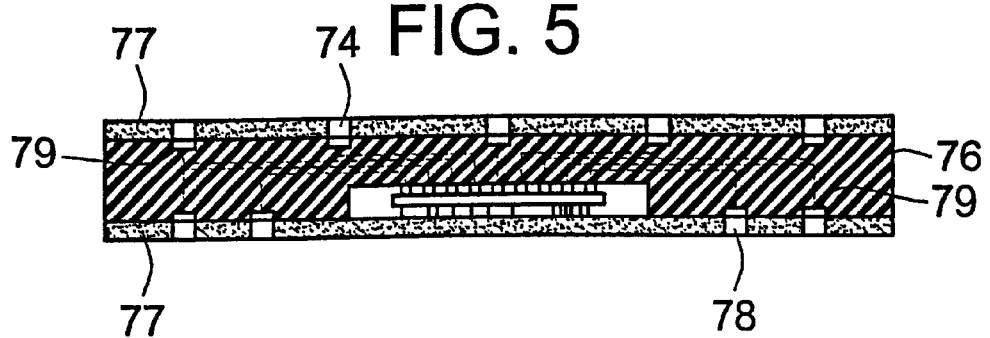
FIG. 5 is a schematic view of a package practiced as a fourth embodiment of the invention.

FIG. 5 is a schematic view of a package practiced as the fourth embodiment of the invention. This package is based on what is known as the ball grid array (BGA). The BGA uses solder balls in place of pins of the conventional pin grid array. Referring to FIG. 5, the package comprises: electrodes 79 of the BGA furnished on principal planes on the face and back of a package body 76; conductive rubber elements 78 connected to the electrodes 79 in place of solder balls to be integrated with the electrodes of BGA; and elastic bodies 77 (elements of such material as elastic rubber or sponge that is electrically insulating and elastic in nature) provided in parallel with the package body 76 on portions of the principal planes not covered by the conductive rubber elements 78.

The package body 76 includes wiring and an opening in which to accommodate an LSI. The body 76 and an LSI housed in its opening make up a package. Because the electrode planes of the package comprise the conductive rubber elements 78 and elastic bodies 77, varying heights of the electrodes are absorbed by elasticity of the conductive rubber elements 78 or elastic bodies 77 under pressure of the socket caps. This arrangement eliminates faulty contact between the contactors and packages electrodes, or between the package electrodes.

Fifth Embodiment

Figure 6:
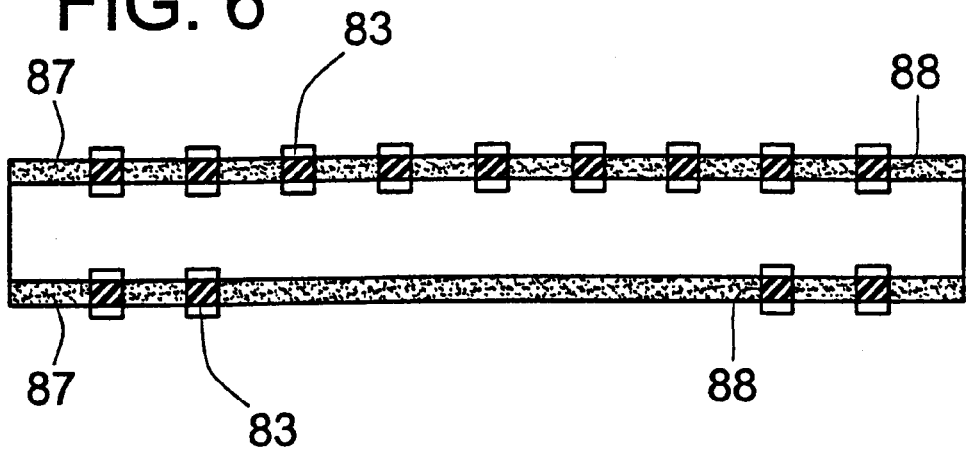
FIG. 6 is a schematic view of a package practiced as a fifth embodiment of the invention.

FIG. 6 is a schematic view of a package practiced as the fifth embodiment of the invention. Referring to FIG. 6, this package is a variation of the fourth embodiment, in which variation conductive plates 83 made of metal or like material are attached to edges of the conductive rubber elements. Because the conductive rubber elements 88 are not in direct contact with the contactors or with the package electrodes, the conductive rubber elements 88 do not wear.

In addition, with the contact planes of the package structure also comprising rubber elements, varying heights of the electrodes are absorbed due to elasticity of the conductive rubber elements 88 or elastic bodies 87.

Sixth Embodiment

Figure 7:
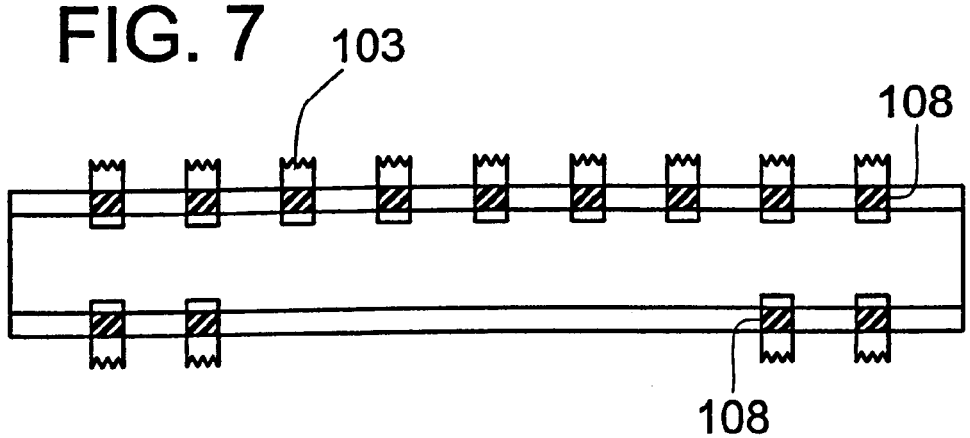
FIG. 7 is a schematic view of a package practiced as a sixth embodiment the invention.

FIG. 7 is a schematic view of a package practiced as the sixth embodiment of the invention. Referring to FIG. 7, this package is a variation of the fifth embodiment, in which variation the conductive plates are replaced by conductors 103 made of metal or like material with projections.

As with the fifth embodiment, the sixth embodiment protects conductive rubber elements 108 from wear. Because the projections scratch surfaces of the contactors or package electrodes, any metal oxide film that may develop over these surfaces will not impair stable contact between the relevant parts.

Seventh Embodiment

Figure 8:
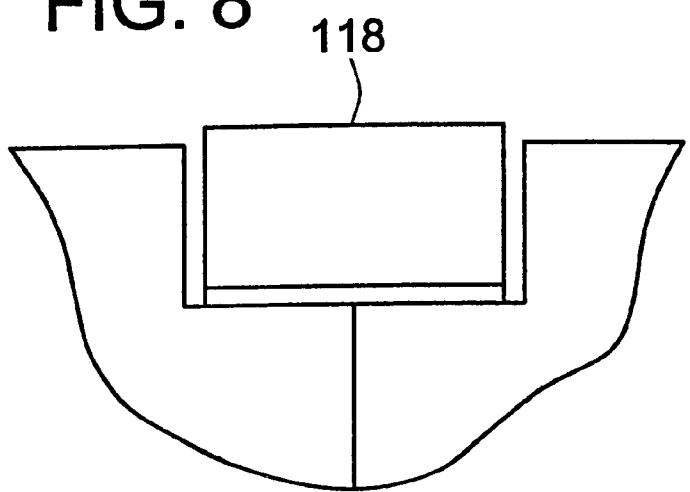
FIGS. 8 to 10 are schematic views of electrode portions each practiced as a seventh embodiment of the invention.

FIG. 8 is a schematic view of an electrode portion practiced as the seventh embodiment of the invention. Referring to FIG. 8, conductive rubber elements 118 instead of solder balls are attached to the electrodes of a BGA for use with a BOST method. This arrangement causes the conductive rubber elements 118 to absorb varying heights of the package electrodes and thereby ensures more stable contact between the relevant parts.

Figure 9:
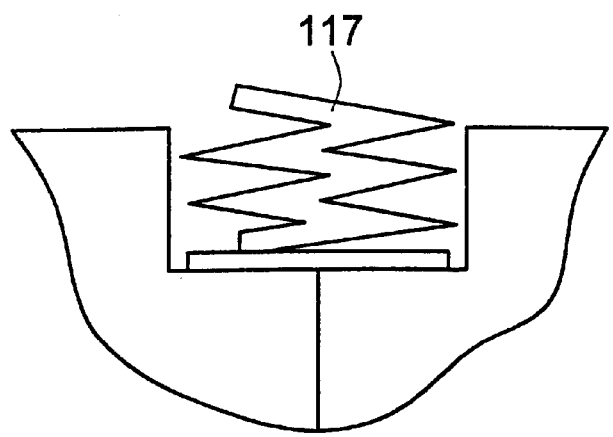

FIG. 9 is a schematic view of another electrode portion in the seventh embodiment. Referring to FIG. 9, spring-like metal elements 117 instead of solder balls are attached to the electrodes of the BGA for use with the BOST method. This arrangement causes the metal elements 117 to absorb varying heights of the package electrodes and thus ensures more stable contact between the relevant parts.

Figure 10:
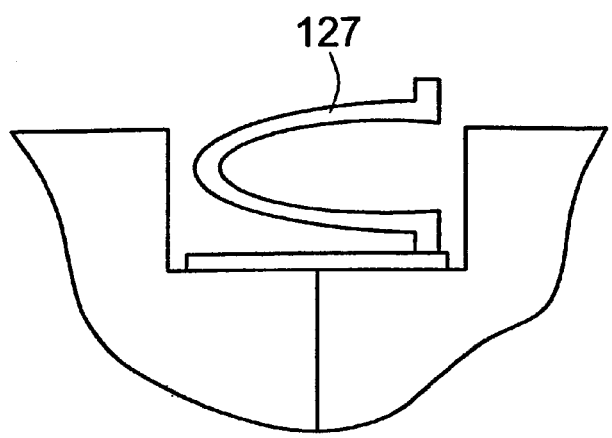

FIG. 10 is a schematic view of another electrode portion in the seventh embodiment. Referring to FIG. 10, U-shaped metal elements 127 instead of solder balls are attached to the electrodes of the BGA for use with the BOST method. This arrangement causes the metal elements 127, in a simpler shape than the element of FIG. 9, to absorb varying heights of the package electrodes and thereby ensures more stable contact between the relevant parts.

In describing the seventh embodiment above, the electrodes of the BGA were shown concave-shaped. Alternatively, the electrodes may be flat in shape.

Eighth Embodiment

Figure 11:
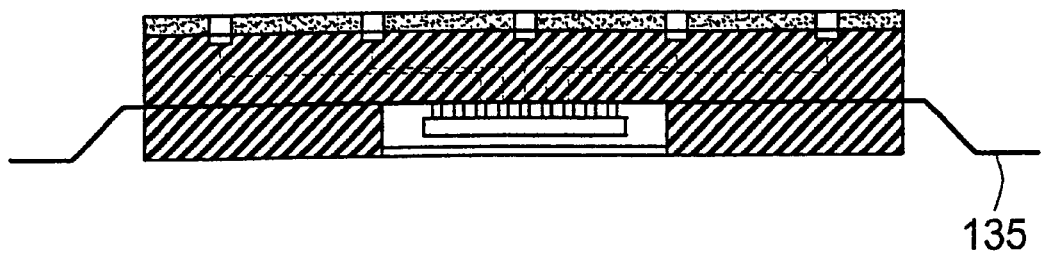
FIG. 11 is a schematic view of a package practiced as an eighth embodiment of the invention.

FIG. 11 is a schematic view of a package practiced as the eighth embodiment of the invention. Referring to FIG. 11, one of its top and bottom principal planes of this package has a structure as that of the fourth embodiment, whereas a lead frame 135 is provided to the other plane. That is, either the top or the bottom principal plane of the package comprises conductive rubber elements connected to BGA electrodes as well as the conductive rubber replacing solder balls integral with the electrodes, while the other principal plane comprises the lead frame 135.

The BOST LSI generally needs, on its surface to be in contact with a DUT, approximately the same number of electrodes as those of the DUT. This makes the contact surface suitable for the BGA structure. On the other hand, the LSI surface to be in contact with a tester has fewer electrodes. It is the reason why the tester side of the package is provided with the lead frame 135.

In the eighth embodiment, the spring property of the lead frame on the tester side of the package helps absorb more pronounced height differences than before.

Ninth Embodiment

Figure 12:
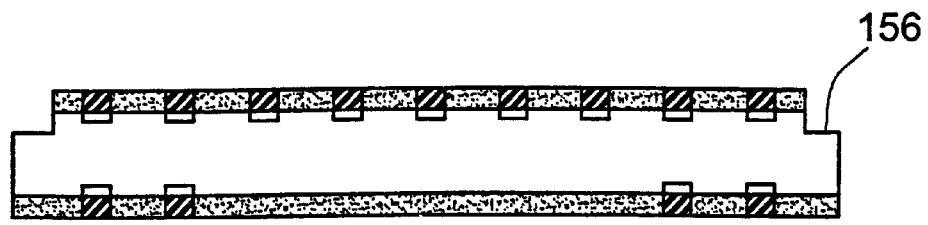
FIG. 12 is a schematic view of a package practiced as a ninth embodiment of the invention.

FIG. 12 is a schematic view of a package practiced as the ninth embodiment of the invention. Referring to FIG. 12, this package comprises, on one of its top and bottom principal planes, staggers 156 in parallel with the package surface. Other details of the structure are the same as those of the package practiced as the fourth embodiment.

Figure 13:
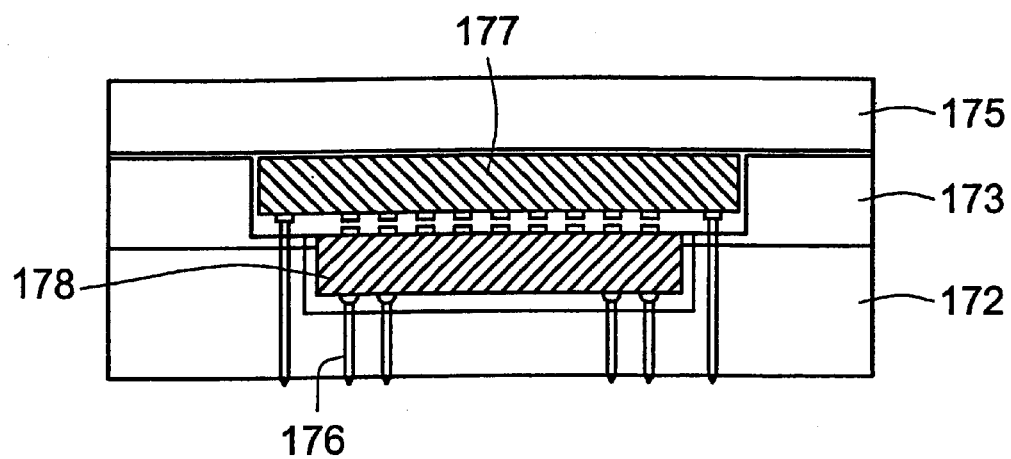
FIG. 13 is a schematic view of a setup in which to practice a BOST method in connection with the ninth embodiment.
Figure 14:
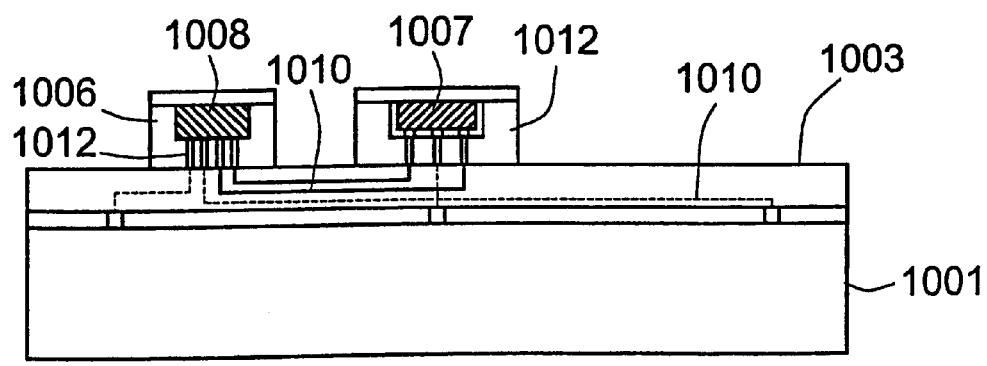
FIG. 14 is a schematic view of a setup in which to practice a conventional BOST method.

FIG. 13 is a schematic view of a setup in which to practice a BOST method in connection with the ninth embodiment. Referring to FIG. 13, this is a socket constituted by a socket body 172 with a space to accommodate a package 178, and by two caps 173 and 175. The cap 173 with a space to accommodate a DUT 177 is used to push electrodes of the package 178 against contactors 176. The cap 175 is used to push the electrodes of the DUT 177 against those of the package 178. In this socket, the DUT 177 is supported by the package 178.

The package 178 has staggers facing the DUT 177. The cap 173 has convex portions that are pushed against the staggers of the package 178 which in turn is pressed against the contactors 176.

In the ninth embodiment, any package smaller than the DUT can be secured by the caps. This ensures stable contact between the contactors 176 on the one hand and the electrodes of the package 178 on the other hand.

The major benefits of the present invention described above are summarized as follows:

According to one aspect of the invention, there is provided as described a testing method for use with a BOST setup, comprising the step of mounting a BOST semiconductor device and a semiconductor device under test on a single socket. This method makes it possible to carry out high-speed tests with high precision while being less influenced by the transmission line configuration than before.

According to another aspect of the invention, there is provided as described a testing method for use with a BOST setup, comprising the step of mounting a BOST semiconductor device, an intermediate board, and a semiconductor device under test on a single socket so as to ensure direct contact between electrodes of the BOST semiconductor device and those of the intermediate board, as well as between electrodes of the semiconductor device under test and those of the intermediate board for testing. This method eliminates the need for aligning the electrodes of the BOST semiconductor device with those of the semiconductor device under test and thus allows the general-purpose BOST semiconductor device to be applied to high-speed testing.

According to a further aspect of the invention, there is provided as described a socket for use in a BOST setup, the socket comprising: a socket body with a space to accommodate a first semiconductor device; a first cap with a space to accommodate a second semiconductor device, the first cap being used to push electrodes of the first semiconductor against contactors; and a second cap used to push electrodes of the second semiconductor device against the electrodes of the first semiconductor device. The inventive socket ensures reliable contact between the first and the second semiconductor devises with connections over the shortest possible distance.

In one preferred variation of the socket of the invention, the first cap may comprise convex portions for pushing the electrodes of the first semiconductor device against the contactors. This structure allows the first semiconductor device, smaller in size than the second semiconductor device, to be securely fixed by the cap and thereby ensures stable contact between the contactors and the electrodes of the first semiconductor device.

According to a yet further aspect of the invention, there is provided as described a semiconductor device for use in a BOST setup, the semiconductor device comprising a BGA structure having conductive rubber elements attached to electrodes, the conductive rubber elements replacing solder balls characteristic of the BGA structure. The inventive device ensures stable contact between the relevant parts by getting the conductive rubber elements to absorb height differences of the package electrodes.

According to another aspect of the invention, there is provided as described a semiconductor device for use in a BOST setup, the semiconductor device comprising a BGA structure having spring-like metal elements attached to electrodes, the spring-like metal elements replacing solder balls characteristic of the BGA structure. The inventive devices also ensures stable contact between the relevant parts by getting the spring-like metal elements to absorb height differences of the package electrodes.

According to an even further aspect of the invention, there is provided as described a semiconductor device for use in a BOST setup, the semiconductor device comprising: electrodes furnished on at lease one of a top and a bottom principal planes of a body of the semiconductor device;

conductive rubber elements connected to the electrodes; and elastic bodies provided in parallel with the semiconductor device body on portions of the principal plane furnished with the conductive rubber elements so as not to cover the conductive rubber elements. The inventive semiconductor device thus structured eliminates faulty contact between the contactors and electrodes thereof as well as between electrodes of another semiconductor device and electrodes thereof by absorbing height differences therebetween.

In a preferred variation of the semiconductor device of the invention, the semiconductor device may further comprise conductive plates attached to edges of the conductive rubber elements. This structure protects the rubber elements against wear.

In another preferred variation of the semiconductor device of the invention, the semiconductor device may further comprise projections attached to edges of the conductive rubber elements. This structure prevents the wear of the conductive rubber elements and, with the projections scratching surfaces of the contactors or electrodes of another semiconductor device, prevents any metal oxide film that may develop on such surfaces from impairing stable contact between the relevant parts.

In a further preferred variation of the semiconductor device of the invention, one of the top and bottom principal planes of the semiconductor device body may comprise staggers in parallel with the semiconductor device body. This structure allows to perform a semiconductor test even when the semiconductor device is smaller than the semiconductor device under test and to be placed under the same.

According to a still further aspect of the invention, there is provided as described a semiconductor device for use in a BOST setup, the semiconductor device comprising: electrodes furnished on one of a top and a bottom principal plane of a body of the semiconductor device; conductive rubber elements connected to the electrodes; elastic bodies provided in parallel with the semiconductor device body on portions of the principal plane so as not to cover the conductive rubber elements; and a lead frame furnished on the other principal plane of the semiconductor device body. The inventive device helps absorb more pronounced height differences than before between the contact surfaces.

Further, the present invention is not limited to these embodiments, but variations and modifications may be made without departing from the scope of the present invention.

The entire disclosure of Japanese Patent Application No. Hei 11-373241 filed on Dec. 28, 1999 including specification, claims, drawings and summary are incorporated herein by reference in its entirety.

What is claimed is:

1. A testing method for a build off self-test (BOST) setup, comprising:

mounting a BOST semiconductor device and a semiconductor device under test in a single socket; and testing the semiconductor device under test using the BOST semiconductor device.

2. The testing method according to claim 1, further comprising mounting an intermediate board on the single socket together with the BOST semiconductor device and the semiconductor device under test to ensure direct contact between electrodes of the BOST semiconductor device and the electrodes of the intermediate board, as well as between electrodes of the semiconductor device under test and electrodes of the intermediate board for testing.

3. The testing method according to claim 1, including placing respective electrodes of the BOST semiconductor device and the semiconductor device under test in direct contact with each other in the single socket for testing.

* * * * *